US008987692B2

(12) United States Patent
Adamec

(10) Patent No.: US 8,987,692 B2
(45) Date of Patent: Mar. 24, 2015

(54) HIGH BRIGHTNESS ELECTRON GUN, SYSTEM USING THE SAME, AND METHOD OF OPERATING THEREOF

(71) Applicant: ICT Integrated Circuit Testing Gesellschaft für Halbleiterprüftechnik GmbH, Heimstetten (DE)

(72) Inventor: Pavel Adamec, Haar (DE)

(73) Assignee: ICT Integrated Circuit Testing Gesellschaft für Halbleiterprüftechnik mbH, Heimstetten (DE)

(*) Notice: Subject to any disclaimer, the term of this patent is extended or adjusted under 35 U.S.C. 154(b) by 0 days.

(21) Appl. No.: 14/203,377

(22) Filed: Mar. 10, 2014

(65) Prior Publication Data
US 2014/0264063 A1 Sep. 18, 2014

(30) Foreign Application Priority Data
Mar. 15, 2013 (EP) .................................. 13159530

(51) Int. Cl.
*H01J 37/073* (2006.01)
*H01J 37/317* (2006.01)
*H01J 37/26* (2006.01)
(Continued)

(52) U.S. Cl.
CPC ............... *H01J 37/073* (2013.01); *H01J 37/26* (2013.01); *H01J 37/3174* (2013.01); *H01J 2237/063* (2013.01); *H01J 2237/06325* (2013.01); *H01J 1/304* (2013.01); *H01J 37/063* (2013.01)
USPC ........ 250/492.3; 250/306; 250/307; 250/310; 250/396 R

(58) Field of Classification Search
CPC ................... H01J 37/073; H01J 2237/06325; H01J 2237/063
USPC ................... 250/306, 307, 310, 396 R, 492.3
See application file for complete search history.

(56) References Cited

U.S. PATENT DOCUMENTS

| 6,297,584 B1* | 10/2001 | Kim et al. ...................... 313/293 |
| 6,903,499 B2* | 6/2005 | Terui et al. ..................... 313/309 |
| 6,943,507 B2* | 9/2005 | Winkler et al. ................ 315/382 |

(Continued)

FOREIGN PATENT DOCUMENTS

| EP | 2034504 A1 | 3/2009 |
| EP | 2242084 A1 | 10/2010 |

(Continued)

OTHER PUBLICATIONS

Extended European Search Report, EP Application No. 13159530.8, Jun. 20, 2013.

*Primary Examiner* — Michael Logie
(74) *Attorney, Agent, or Firm* — Patterson & Sheridan, LLP

(57) ABSTRACT

A charged particle beam source device adapted for generating a charged particle beam is provided. The charged particle beam source device includes an emitter tip adapted for providing charged particles. Furthermore, an extractor electrode having an aperture opening is provided for extracting the charged particles from the emitter tip. An aperture angle of the charged particle beam is 2 degrees or below the aperture angle being defined by a width of the aperture opening and a distance between the emitter tip and the extractor electrode, wherein the distance between the emitter tip and the extractor electrode is a range from 0.1 mm to 2 mm.

20 Claims, 4 Drawing Sheets

(51) Int. Cl.
*H01J 1/304* (2006.01)
*H01J 37/063* (2006.01)

(56) References Cited

U.S. PATENT DOCUMENTS

| | | | |
|---|---|---|---|
| 2002/0020822 A1* | 2/2002 | Okunuki | 250/492.3 |
| 2004/0119023 A1 | 6/2004 | Nakasuji et al. | |
| 2004/0135526 A1* | 7/2004 | Winkler et al. | 315/382 |
| 2004/0238809 A1* | 12/2004 | Adamec et al. | 257/10 |
| 2008/0211376 A1* | 9/2008 | Yasuda et al. | 313/414 |
| 2008/0283745 A1* | 11/2008 | Adamec et al. | 250/307 |
| 2009/0020708 A1* | 1/2009 | Winkler et al. | 250/424 |
| 2009/0152462 A1* | 6/2009 | Ishitani et al. | 250/307 |
| 2009/0160308 A1* | 6/2009 | Yamamoto et al. | 313/336 |
| 2011/0240855 A1 | 10/2011 | Ohshima et al. | |
| 2012/0085925 A1* | 4/2012 | Kasuya et al. | 250/453.11 |
| 2012/0091359 A1* | 4/2012 | Lanio et al. | 250/396 R |
| 2013/0087704 A1* | 4/2013 | Ishitani et al. | 250/307 |
| 2014/0264019 A1* | 9/2014 | Adamec | 250/310 |

FOREIGN PATENT DOCUMENTS

| | | |
|---|---|---|
| JP | H08-222163 A | 8/1996 |
| WO | 2007/041444 A2 | 4/2007 |
| WO | 2008/101713 A2 | 8/2008 |

* cited by examiner

HIGH BRIGHTNESS ELECTRON GUN, SYSTEM USING THE SAME, AND METHOD OF OPERATING THEREOF

FIELD

Embodiments of the present application relate to charged particle beam devices adapted, e.g. for testing system applications, lithography system applications, integrated circuit testing, defect review, critical dimensioning applications or the like. It also relates to methods of operation thereof. Further, embodiments of the present application relate to applications using a high brightness electron gun for providing secondary particles, e.g. for defect review applications, critical dimensioning applications for electron beam inspection (EBI).

Specifically, embodiments of the present application relate to a charged particle beam source device or an electron beam device for generating a charged particle beam or electron beam. In addition to that, the present application relates to a method of operating an electron beam device for a wafer imaging system.

BACKGROUND

Charged particle beam apparatuses have many functions in a plurality of industrial fields, including, but not limited to, inspection of electronic circuits during manufacturing, exposure systems for lithography, detecting devices, defect inspection tools, and testing systems for integrated circuits. There is a need for inspection devices operating at a spatial resolution in the micrometer and nanometer range.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams because their wavelengths are shorter than the wavelengths of light beams.

High resolution imaging devices based on electron optics systems require low electron-electron interaction for providing a small width of the energy spectrum. In electron microscopes, e.g. the higher an electron current of the electron beam, the higher the electron-electron interaction is. Thus, providing electron beams for inspection purposes having low energy spread and low blur is an issue.

SUMMARY

According to one embodiment, a wafer imaging system configured for imaging a wafer is provided. The system includes an electron beam source device configured for generating a primary electron beam for a wafer imaging system. The electron beam source device includes a gun chamber, wherein the gun chamber can be evacuated, an emitter tip adapted for providing electrons wherein the emitter tip is provided as a cold field emitter or thermally assisted cold field emitter within the gun chamber, and an extractor electrode having an aperture opening and adapted for extracting the electrons from the emitter tip, wherein the extractor electrode is provided in the gun chamber, wherein an aperture angle of the beam source device is 2 degrees or below the aperture angle being defined by a width of the aperture opening and a distance between the emitter tip and the extractor electrode, wherein the distance between the emitter tip and the extractor electrode is a range from 0.1 mm to 2 mm, and further comprising a suppressor electrode arranged concentrically around the emitter tip within the gun chamber, the emitter tip protruding through the suppressor electrode. The wafer imaging system further includes an objective lens configured for focusing the electron beam on the wafer, at least one condenser lens provided between the emitter tip and the objective lens, and a scanning deflector arrangement for scanning the electron beam over the wafer to generate the image of the wafer.

According to another embodiment, an electron beam source device configured for generating a primary electron beam and providing an upgrade kit for a wafer imaging system is provided. The electron beam source device includes a gun chamber, wherein the gun chamber can be evacuated, an emitter tip adapted for providing electrons wherein the emitter tip is provided as a cold field emitter or thermally assisted cold field emitter within the gun chamber, and an extractor electrode having an aperture opening and adapted for extracting the electrons from the emitter tip, wherein the extractor electrode is provided in the gun chamber, wherein an aperture angle of the beam source device is 2 degrees or below the aperture angle being defined by a width of the aperture opening and a distance between the emitter tip and the extractor electrode, wherein the distance between the emitter tip and the extractor electrode is a range from 0.1 mm to 2 mm, and further comprising a suppressor electrode arranged concentrically around the emitter tip within the gun chamber, the emitter tip protruding through the suppressor electrode.

According to yet another embodiment, a method of operating an electron beam source device for a wafer imaging system is provided. The method includes emitting electrons from an emitter tip wherein the emitter tip is provided as a cold field emitter or thermally assisted cold field emitter, and extracting the electrons from the emitter tip with an extractor electrode having an aperture opening, wherein an aperture angle of the beam source device is 2 degrees or below the aperture angle being defined by a width of the aperture opening and a distance between the emitter tip and the extractor electrode, wherein the distance between the emitter tip and the extractor electrode is a range from 0.1 mm to 2 mm, and controlling emission of the electrons with a suppressor electrode arranged concentrically around the emitter tip, the emitter tip protruding through the suppressor electrode.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE DRAWINGS

Figure 1:
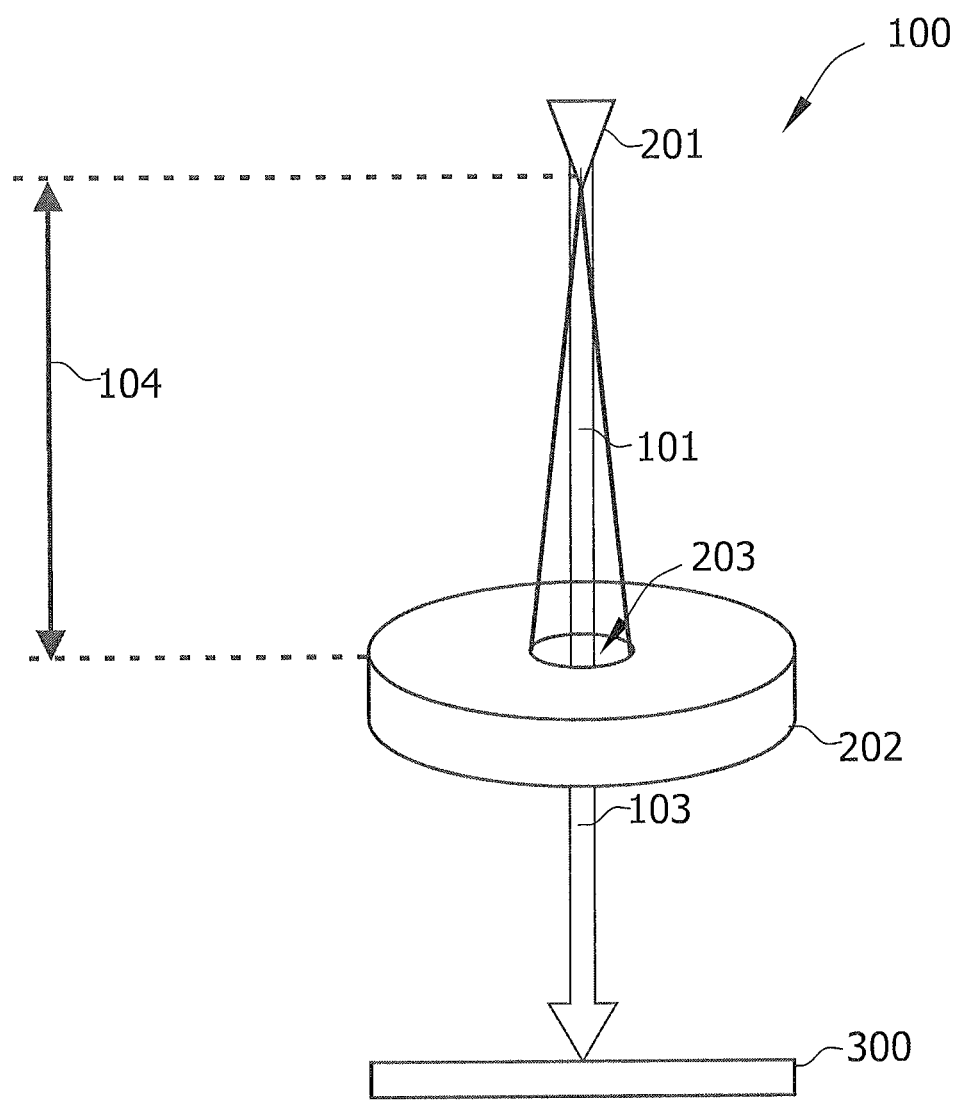
FIG. 1 shows schematically an electron beam source device having an emitter tip and an extractor electrode having an aperture opening.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present disclosure, in the following the electron beam imaging systems and charged particle beam device or components thereof will exemplarily be referred to as a charged particle beam device including the detection of secondary electrons. Embodiments of the present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

A "specimen" or "wafer" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications In the following the charged particle beam source device or the electron beam device according to some embodiments or components thereof will described. The charged particle beam source device is adapted for generating a charged particle beam and includes an emitter tip adapted for providing charged particles. Furthermore, an extractor electrode is provided which has an aperture opening and is adapted for extracting the charged particles from the emitter tip. The aperture opening may have a specified width which may be provided according to beam current requirements. According to a typical embodiment which can be combined with other embodiments described herein, the aperture opening may be of circular shape, and the width of the aperture opening is then defined by a diameter of the circular shape.

According to a typical embodiment which can be combined with other embodiments described herein, an aperture angle of the charged particle beam may be provided by 2 degrees or below, for example in a range from 0.1 degrees to 1 degrees, and typically amounts to approximately 0.5 degrees. The aperture angle may be defined by the aperture diameter, at least for circular aperture openings, and a distance between the emitter tip and the extractor electrode. According to a typical embodiment which can be combined with other embodiments described herein, providing the aperture angle of the beam source device includes providing an area of the aperture opening such that the charged particle beam current emitted by the emitter tip is reduced by a factor larger than 10, typically by a factor larger than 100, and specifically by a factor larger than 1000.

According to some embodiments, which can be combined with other embodiments described herein, the devices, the apparatuses and methods are configured for or are applied for electron beam inspection, for critical dimensioning applications and defect review applications. Generally, when referring to a "beam current", it is understood that the beam of charged particles carries a predetermined charge. The charged particle beam source device can be in particular used for high speed scanning and detection, for example for electron beam inspection system (EBI). Thereby, embodiments described herein typically relate to wafer imaging, e.g. during EBI.

Embodiments described herein relate particularly to high brightness emitters, such as CFEs and thermally assisted CFEs. Thereby, it should be considered that on industrial standards high stability for automation purposes and/or long system uptimes need to be provided. The brightness of the source is an important parameter for the achievement of high resolution and high throughput in the electron beam based inspection system. The typical source is based on the sharp conductive (metallic) tip where the electrons are extracted by high electric field (cold field emission, CFE), possibly assisted by increased temperature (thermal assisted field emission). The electrons are then emitted from very small surface area. This makes the emission very sensitive even to single atom adsorption on the emitting surface. The atoms that might adsorb on the emitting surface originate mainly from the surrounding surfaces, especially from the extracting electrode where desorption of atoms can be stimulated by electron beam coming from the emitter tip.

Embodiments described herein relate to a charged particle beam source or an electron beam device adapted for generating a charged particle beam including an emitter tip and an extractor electrode. The aperture angle of a charged particle beam may be adjusted or provided in a predetermined range. Furthermore, embodiments described herein relate to a method of operating a charged particle beam source device wherein the method includes providing an emitter tip, providing an extractor electrode arranged at a predetermined distance from the emitter tip, extracting charged particles from the emitter tip using the extractor electrode, and providing an aperture angle of the beam source device in a predetermined range.

FIG. 1 shows a schematic arrangement of an electron beam source device 100 having a predetermined electrode arrangement. The electrode arrangement includes an emitter tip 201 for providing charged particles and an extractor electrode 202 having an aperture opening 203. The extractor electrode 202 is adapted for extracting the charged particles from the emitter tip 201. The electron beam source device may provide electron beams for micrometer and nanometer scale process control, inspection or structuring such that, in order to generate electrons emitted from the emitter tip 201, the extractor electrode 202 is provided with a positive voltage with respect to the emitter tip 201.

An electron beam (primary electron beam) 101 is thus generated by electrons emitted from the emitter tip 201 and being accelerated towards the extractor electrode 202. A portion of the primary electron beam 101 is transmitted through the aperture opening 203 and is provided as a transmitted electron beam 103 for inspecting and/or structuring a specimen 300.

According to a typical embodiment which can be combined with other embodiments described herein, the aperture opening 203 may be of circular shape such that the width of the aperture opening 203 may be defined by its diameter D. An aperture angle 102 of the electrode arrangement (shown in FIG. 2) may then be defined by a ratio of an area of the aperture opening 203 with respect to a distance between the emitter tip 201 and the extractor electrode 202, i.e. with respect to an extractor-tip distance 104. The aperture angle 102 may thus be defined by the following equation:

$$\Omega = \frac{A}{r^2} \text{ [sr]} \quad (1)$$

wherein A is the area of the aperture opening 203, r is the extractor-tip distance 104 and Ω is the aperture angle 102, measured in sterad (ster, sr).

For a circular aperture opening 203, the aperture angle 102 may be defined by the diameter of the aperture opening 203 and the extractor-tip distance 104 according to the following equation:

$$\alpha = 2 \cdot \arctan\left(\frac{D/2}{r}\right) \text{ [radiant]} \quad (2)$$

measured in radiant wherein D is the diameter of a circular aperture opening 203 and r is the extractor-tip distance 104. The aperture angle α measured in radiant may be converted into an aperture angle α' measured in degrees according to the following equation:

$$\alpha' = \frac{180}{\pi}\alpha \text{ [degrees]} \quad (3)$$

wherein the aperture angle is the full angle as also illustrated in the figure.

In the electrode arrangement 200 according to a typical embodiment which can be combined with other embodiments described herein, the emitter-tip electrode 201 is arranged opposite to the extractor electrode 202, the extractor electrode 202 being positively biased with respect to the emitter-tip electrode 201. Thus, an electron beam (primary electron beam) 101 is generated and transmitted through the aperture opening 203 of the extractor electrode 202 such that the transmitted electron beam 103 may be provided at a surface of the specimen 300.

According to a typical embodiment, if the aperture angle 102 is defined in degrees (°) according to equation (3) above, the aperture angle 102 of the charged particle beam may be adjusted or provided in a range from 0.1 degrees to 2 degrees, and typically may amount to approximately 0.5 degrees. According to a typical embodiment which may be combined with other embodiments described herein, the emitter tip 201 may be provided as a cold field emitter. According to a further embodiment, the emitter tip 201 may be provided as a thermally assisted field emitter for thermal generation of electrons emitted from the tip of the emitter tip 201. The material of the emitter tip 201 may include a tungsten material, and in accordance with a typical embodiment, the emitter tip 201 may include a tungsten W-310 crystal tip.

According to typical embodiments, the extractor-tip distance 104, i.e. the distance between the emitter tip 201 and the extractor electrode 202, may be in a range from 0.1 mm to 2 mm, typical in a range from 0.3 mm to 2 mm. It can amount to less than 2 mm, and typically can amount to less than 1 mm. This short distance between the emitter tip 201 and the extractor electrode 202 provides for a mean free path that may be adjusted or provided such that Coulomb interactions are reduced. Specifically, the aperture angle of the beam source device may be provided such that the area of the aperture opening causes the charged particle beam current emitted by the emitter tip to be reduced a factor larger than 10, typically by a factor larger than 100, and specifically by a factor larger than 1000.

Thus, by providing a short extractor-tip distance 104, a beam current of the electron beam may be reduced to a minimum value on the possibly shortest distance from the emitter tip, which results in a reduction of Coulomb interactions. Thus, blurring of the beam and an increase of energy spread of the electron beam may be reduced. According to a typical embodiment which may be combined with other embodiments described herein, the beam current of the electron beam 101 is reduced by providing a short distance between the emitter tip 201 and the extractor electrode 202 (FIG. 1).

In order to provide both a high resolution and a high throughput of an electron beam-based inspection system, it is desired that the brightness of the electron beam source device is high. High beam currents, however, result in unwanted Coulomb interactions. A typical brightness for electron microscopy may amount to approximately $3 \times 10^8$ A/m²/sr/eV or more, more typically to approximately $1 \times 10^9$ A/m²/sr/eV. The electron beam source device 100 shown in FIG. 1 may be based on cold field emission (CFE), possibly assisted by increased temperature, such that thermal field emission (TFE) is also provided. The electrons are emitted from a very small surface area of the emitter tip 201 such that an emission current density is very high. Coulomb interactions mainly occur on the first view 100 μm of their path.

According to typical embodiments, the emitter tip 201 may include any material selected from the group consisting of: tungsten, molybdenum, tantalum, carbide such as HfC, ZrC, and any combinations thereof. In order to provide electron admission from the emitter tip 201 using thermally assisted field emission, the emitter tip 201 may be heated. According to a typical embodiment, the emitter tip 201 may be heated to a temperature above ambient temperature.

Figure 2:
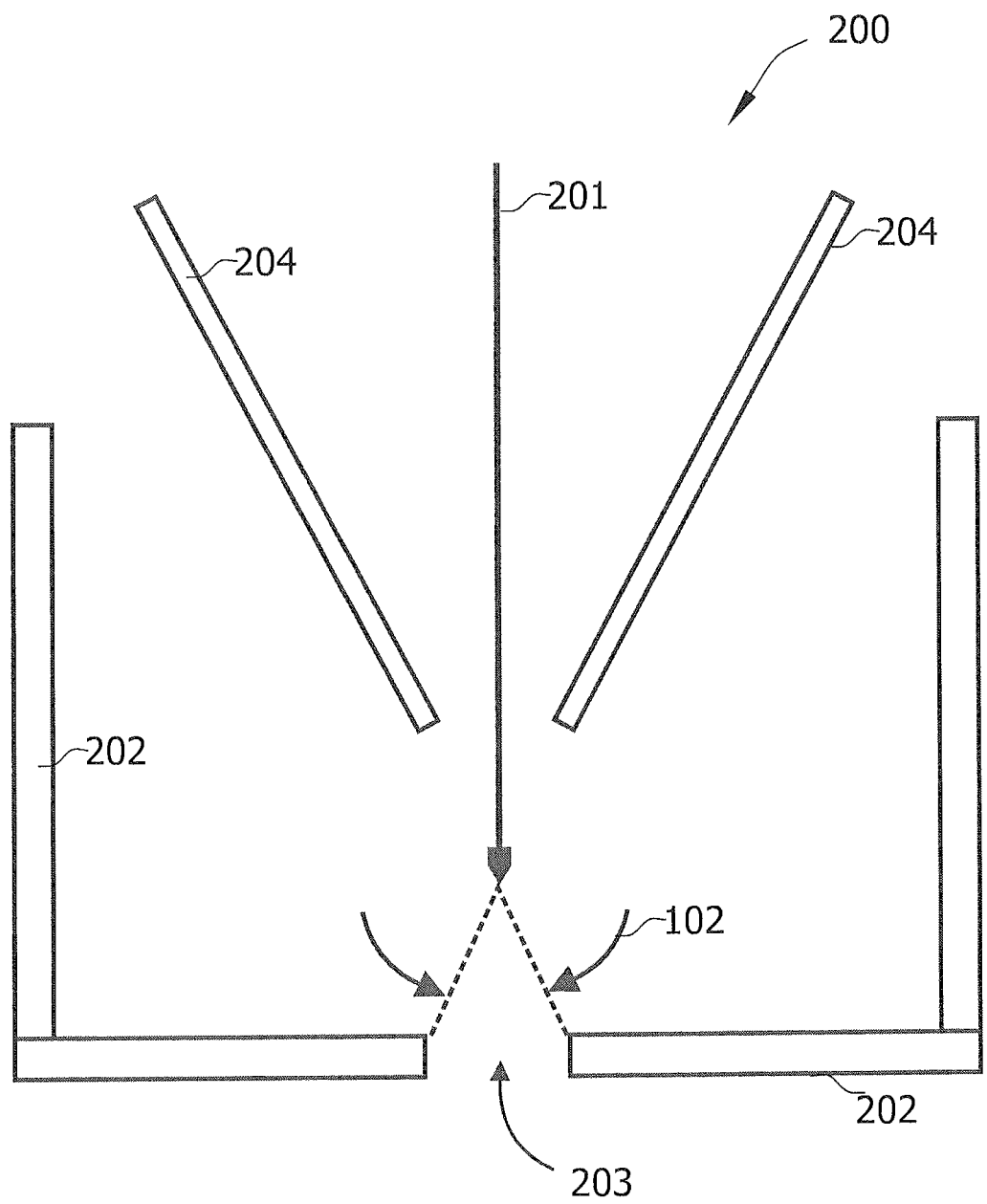
FIG. 2 is a side sectional view of an electrode arrangement provided for the electron beam source device shown in FIG. 1.

FIG. 2 is a side-sectional view of an electrode arrangement 200 which may be provided for an electron beam source device 100 shown in FIG. 1. As shown in FIG. 2, a cup-shaped extractor electrode 202 is arranged concentrically around the emitter tip 201. As has already been shown in FIG. 1, the extractor electrode 202 has an aperture opening 203 through which a transmitted electron beam 103 may pass (not shown in FIG. 2).

According to typical embodiments which may be combined with other embodiments described herein, the shape of the aperture opening 203 may be circular, or the aperture opening 203 may exhibit any non-circular form. Thereby, a cross-sectional shape of the aperture opening 203 may be selected from the group consisting of a circular aperture opening, a square aperture opening, a triangular aperture opening, a rectangular aperture opening and an elliptical aperture opening. According to a typical embodiment which can be combined with other embodiments described herein, the aperture opening may be of circular shape, and the width of the aperture opening may then be defined by a diameter of the circular shape.

According to another typical embodiment, which may be combined with embodiments described herein, the electron beam source device 100 (FIG. 1) may have an electrode arrangement 200 (FIG. 2) which includes a suppressor electrode 204. According to a further typical embodiment, the suppressor electrode 204 may be arranged around the emitter tip 201, wherein the emitter tip 201 protrudes through the suppressor electrode 204. The suppressor electrode 204 may be adapted for controlling the emission current and the propagation of the emitted electrons.

As shown in FIG. 2, the aperture angle 102 is defined by a size or the area of the aperture opening 203 and a distance between the emitter tip 201 and the extractor electrode 202.

Figure 3:
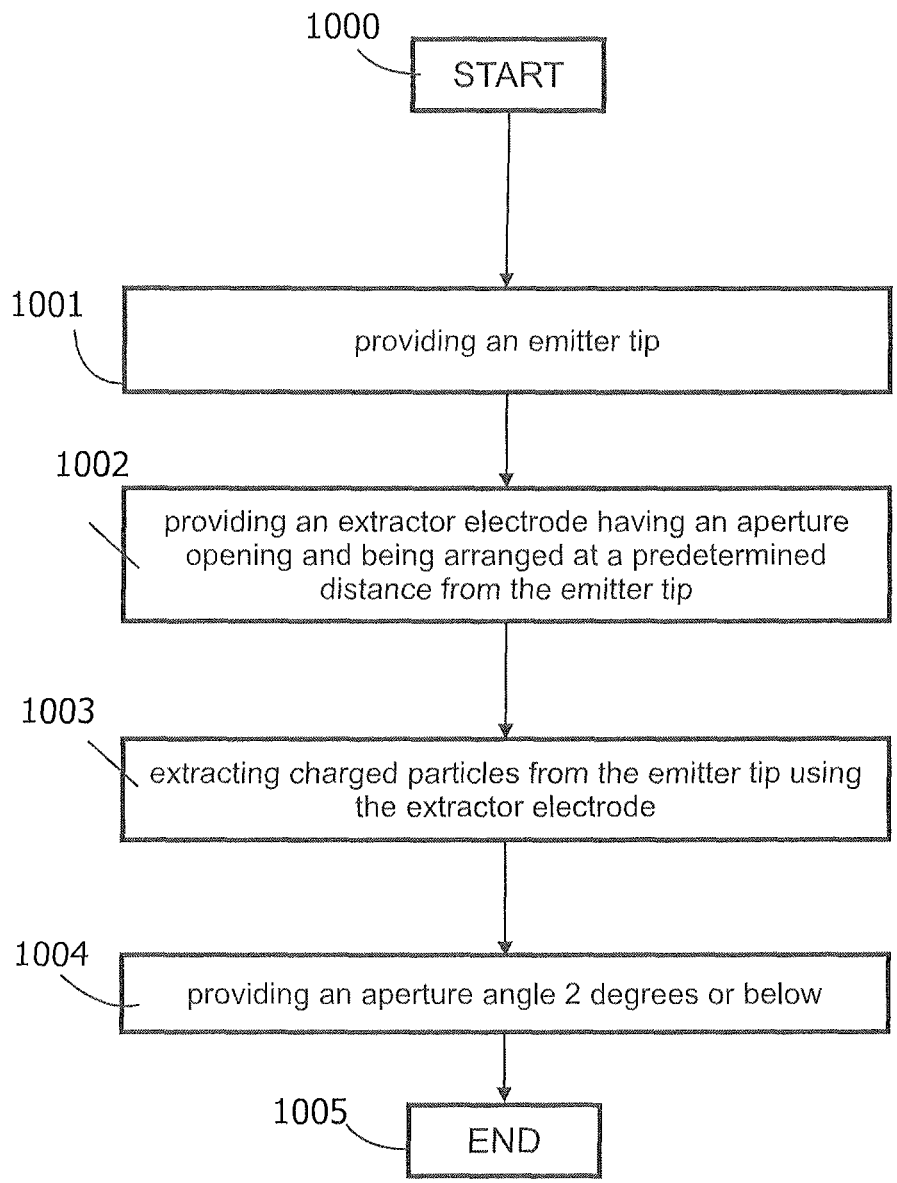
FIG. 3 is a flowchart illustrating a method of operating a charged particle beam source device.

FIG. 3 is a flowchart illustrating a method of operating a charged particle beam source device. The procedure illustrated in FIG. 3 starts at a block 1000. Then, at a block 1001, an emitter tip 201 is provided. Furthermore, at a block 1002, an extractor electrode 202 arranged at a predetermined distance from the emitter tip 201 is provided.

Proceeding to a block 1003, charged particles are extracted from the emitter tip 201 using the extractor electrode 202, i.e. electrons may be extracted by means of a potential difference between the extractor electrode 202 and the emitter tip 201, wherein the extractor electrode 202 is at a positive potential with respect to the emitter tip 201. Thereby, an electric field between the extractor electrode 202 and the emitter tip 201 may have a field strength in a range between 1 kV/mm and 20 kV/mm, typically higher than 5 kV/mm, and even more typically higher than 10 kV/mm.

According to typical embodiments, a potential difference between the extractor electrode and the emitter tip is applied, wherein the potential difference is in a range between 3 kV and 20 kV, typically 5 kV or higher. According to further additional or alternative implementations, the potential difference between the emitter and the extractor can be provided as a potential difference that is 6 kV or higher per 1 mm of tip-extractor distance, in particular ≥3 kV for 0.5 mm and below, ≥6 kV for 1 mm, ≥12 kV for 2 mm.

Then, in a block 1004, an aperture angle 102 of the beam source device is adjusted or provided to be 2 degrees or below, for example in a range from 0.01 degrees to 1 degrees, and typically the angle amounts to approximately 0.5 degrees. The aperture angle 102 is defined by a ratio of the width of the aperture opening 203 and a distance between the emitter tip 201 and the extractor electrode 202. According to a typical embodiment which may be combined with other embodiments described herein, adjusting or providing the aperture angle 102 of the beam source device 100 may include adjusting or providing for the distance 102 between the emitter tip 201 and the extractor electrode 202 in a range from 0.1 mm to 2 mm, typically in a range from 0.5 mm to 2 mm, and more typically to a value of less than 2 mm, even more typically to a value of less than 1 mm.

According to yet further, embodiments, which can be combined with other embodiments, and particularly to even better distinguish over micro-columns or mini-columns, the distance of the emitter to the specimen stage is 100 mm or above. Yet further a particularly beneficial embodiment for the wafer inspection systems includes the objective lens with a magnetic lens component and even more specifically with a magnetic lens component and a retarding field electrostatic lens component. Yet, even further, the acceleration voltage between the emitter and the extractor is typically 4 kV or above.

The procedure of adjusting or providing the aperture angle 102 of the electron beam and the electron beam source device, respectively, may be based on adjusting or providing an area of the extractor electrode aperture opening 203 such that the charged particle beam current is reduced by a factor larger than 10, typically be a factor larger than 100, and specifically by a factor lager than 100 as compared to conventional electron beam devices.

Figure 4:
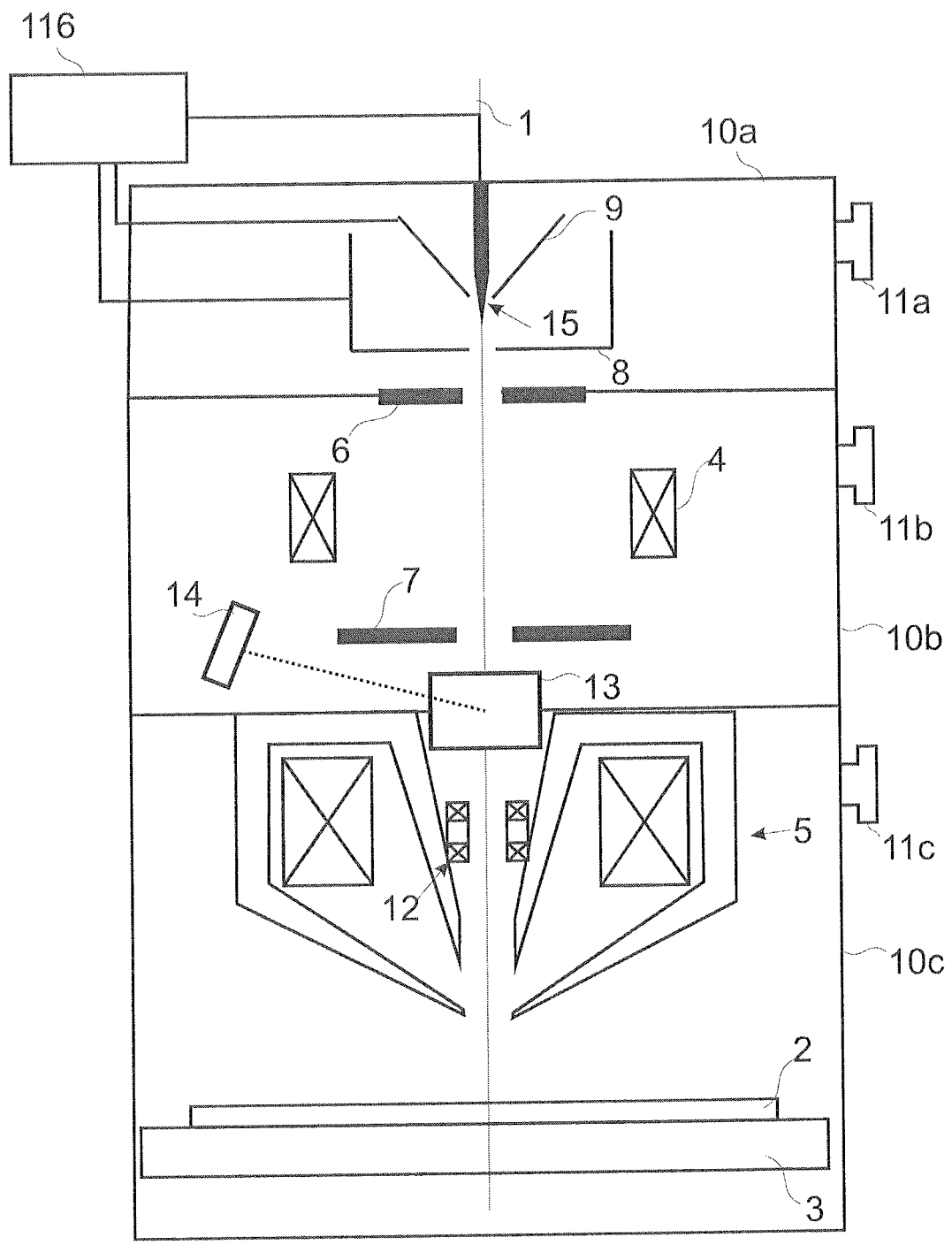
FIG. 4 shows a schematic side view of a charged particle beam device or wafer imaging system with an electron beam device according to embodiments of the present invention.

FIG. 4 illustrates embodiments according to the present invention. Generally, electron beam devices are operated under vacuum conditions. Therefore, a vacuum pump is connected to a port of each chamber of the device. Within FIG. 4, a gun chamber 10a, an intermediate vacuum chamber 10b and a specimen chamber 10c are provided. Typically, each of the chambers has one or more vacuum ports 11a, 11b and 11c, respectively, for connecting of vacuum pumps or vacuum pump systems. Thereby, the requirement for the degree of vacuum is increasing from the specimen chamber to the gun chamber, i.e. the gun chamber has typically the lowest pressure in the column.

Gas molecules, which could be ionized by the electron beam, are pumped out of the device. Without limiting the scope of the invention to systems with several chambers, commonly, the device is subdivided into different chambers 10a to 10c. For example, the vacuum required for operation of an electron gun has a lower pressure than the vacuum required close to a specimen. Thus, it is common to provide at least a gun chamber 10a, a chamber 10b for other beam guiding means in the column and a specimen chamber 10c. The vacuum pumps are operated most of the time to pump molecules, which get into one of the chambers during assembly of the electron beam device, during maintenance, through leaks or through introduction of a new specimen, out of the chamber. Before the intended use of the device starts, the chambers have to be pumped down to a determined pressure level.

During intended use, e.g. imaging, e.g. during inspection or testing, or patterning of specimen 2, electron beam emitter 15 emits an electron beam along optical axis 1. Thereby, the term "intended use" is to be understood as conducting measurements or patterning for, e.g imaging, inspection, testing, patterning for lithography or the like, whatever purpose the electron beam device has.

Cold field emitters have particularly high demands for cleanliness of the gun chamber 10a. Accordingly, pressures of $1 \times 10^{-11}$ mbar or below are provided. Typically, pumps selected from the group consisting of: a getter pump, a sublimation pump, e.g. a titanium sublimation pump, and a NEG (non-evaporable getter) are connected to vacuum flange 11a.

For emission of e.g. electrons, the emitter tip is biased to a negative potential as compared to the extractor such that a voltage of 3 keV to 20 keV is provided between the emitter 15 and the extractor 8 as described according to embodiments described herein. The suppressor is thereby used during normal operation to adjust the divergence of the emitted beam, e.g., such that a beam shaping at the anode 6 or at another final aperture can optionally result in the desired beam current.

According to embodiments described herein, a controller is provided, which is configured to conduct a cleaning process. The controller 116 is connected to the suppressor and the extractor such that electrons emitted and forming the primary electron beam are controlled, e.g. in divergence and beam current.

During normal operation, the emitted electron beam is further guided with the following components. The electrons are extracted by the extraction electrode 8. The electrons forming the primary electron beam are accelerated along the optical axis 1 through anode 6 or a beam aperture provided instead of the anode 6 towards the specimen.

A first condenser 4 might be used to focus the electron beam. Thus, electrons do not move in arbitrary directions as compared to the optical axis. Instead, the electrons move along the optical axis and are focused. Extractor 8 and anode 6 have e.g. a potential of 5 kV with respect to the emitter. Thereby, electrons of the electron beam emitter are accelerated towards specimen 2. Condenser lens 4 and aperture 7 are used to further shape the electron beam. Additionally, depending on the strength of the focusing field of condenser 4, more or less of the electron beam is suppressed by aperture 7. Thus, the beam current applied to the specimen can be adjusted with the strength of the focusing field of the condenser.

Objective lens 5 focuses the electron beam on specimen 2. Thereby, an electron beam spot of a few nanometers can be achieved. This beam spot can either be used to image the specimen or write a pattern thereon.

According to typical embodiments, which can be combined with other embodiments described herein, a magnetic-electrostatic objective lens with a magnetic lens component and an electrostatic lens component is provided, Thereby, the electrostatic lens component can be provided as a retarding lens in order to decelerate the primary electron beam from the high energy in the column to the lower landing energy, e.g. of 1 keV or below. The combination of the emitter according to embodiments described herein and the retarding objective lens is particularly useful for having a high current density on the specimen or wafer. Accordingly, this combination is particularly beneficial for high throughput.

Scan deflection arrangement 12 can be used for deflecting the beam from on pixel of the image another pixel of the image. Further deflectors (not shown) can be used for adjusting the beam position relative to optical axis 1. Further, the specimen, which is located on specimen stage 3, can be moved two-dimensionally in relation to the optical axis by moving the specimen stage.

A beam separator 13 can be used to separate the signal electrons from the primary electrons originating from the emitter tip. Thereby, the signal electrons can be guided onto the detector 14. According to typical embodiments, the beam separator can include a magnetic deflector, a Wien filter, a sector unit such as an hemispherical sector unit, or combinations thereof.

In light of the above, a plurality of electron beam devices for generating a primary electron beam have been described. Thereby, the electron beam devices, which can also be described as a source device can provide for a high brightness, which can be beneficial for wafer imaging applications, e.g. critical dimensioning, defect review, wafer inspection (EBI) or the like. As described particularly with respect to FIG. 4, embodiments also relate to wafer imaging systems configured for imaging a wafer. The source devices and electron beam device can thereby serve as an upgrade kit for a wafer imaging system. The systems can include beyond the electron beam device according embodiments described herein, one or more of the following components: an objective lens configured for focusing the electron beam on the wafer, wherein the objective lens comprises a magnetic lens component and, optionally an electrostatic lens component; at least one condenser lens provided between the emitter tip and the objective lens; a scanning deflector arrangement for scanning the electron beam over the specimen or the wafer to generate the image of the wafer; and a beam separator for spatially separating the electrons emitted from the emitter tip and forming the primary electron beam from electron originating from the wafer and forming the signal electron beam.

While the foregoing is directed to embodiments of the invention, other and further embodiments of the invention may be devised without departing from the basic scope thereof, and the scope thereof is determined by the claims that follow.

The invention claimed is:

1. A wafer imaging system configured for imaging a wafer, comprising:
   an electron beam source device configured for generating a primary electron beam for a wafer imaging system, the device comprising:
      a gun chamber, wherein the gun chamber can be evacuated;
      an emitter tip adapted for providing electrons wherein the emitter tip is provided as a cold field emitter or thermally assisted cold field emitter within the gun chamber; and
      an extractor electrode having an aperture opening and adapted for extracting the electrons from the emitter tip, wherein the extractor electrode is provided in the gun chamber,
      wherein an aperture angle of the beam source device is 2 degrees or below, the aperture angle being defined by a width of the aperture opening and a distance between the emitter tip and the extractor electrode, wherein the distance between the emitter tip and the extractor electrode is in a range from about 0.1 mm to about 2 mm; and
      further comprising a suppressor electrode arranged concentrically around the emitter tip within the gun chamber, the emitter tip Protruding through the suppressor electrode;
   the system further comprises:
   an objective lens configured for focusing the electron beam on the wafer;
   at least one condenser lens provided between the emitter tip and the objective lens; and
   a scanning deflector arrangement for scanning the electron beam over the wafer to generate the image of the wafer.

2. The system according to claim 1, wherein the distance between the emitter tip and the extractor electrode is in a range from about 0.2 mm to about 1.5 mm.

3. The system according to claim 1, wherein the emitter tip comprises a material selected from the group consisting of tungsten, molybdenum, tantalum, carbide and any combinations thereof.

4. The system according to claim 3, wherein the emitter tip is a tungsten based W(310) crystal tip.

5. The system according to claim 1, wherein the objective lens is a compound magnetic-electrostatic retarding objective lens.

6. The system according to claim 1, further comprising:
   a beam separator for spatially separating the electrons emitted from the emitter tip and forming the primary electron beam from electron originating from the wafer and forming a signal electron beam.

7. An electron beam source device configured for generating a primary electron beam and providing an upgrade kit for a wafer imaging system, the device comprising:
   a gun chamber, wherein the gun chamber can be evacuated;
   an emitter tip adapted for providing electrons wherein the emitter tip is provided as a cold field emitter or thermally assisted cold field emitter within the gun chamber; and
   an extractor electrode having an aperture opening and adapted for extracting the electrons from the emitter tip, wherein the extractor electrode is provided in the gun chamber,
   wherein an aperture angle of the beam source device is 2 degrees or below, the aperture angle being defined by a width of the aperture opening and a distance between the emitter tip and the extractor electrode, wherein the distance between the emitter tip and the extractor electrode is in a range from about 0.1 mm to about 2 mm; and
   further comprising a suppressor electrode arranged concentrically around the emitter tip within the gun chamber, the emitter tip protruding through the suppressor electrode.

8. The electron beam source device according to claim 7, wherein the distance between the emitter tip and the extractor electrode is in a range from between about 0.2 mm to about 1.5 mm.

9. The electron beam source device according to claim 7, wherein the emitter tip comprises a material selected from the group consisting of tungsten, molybdenum, tantalum, carbide and any combinations thereof.

10. The electron beam source device according to claim 9, wherein the emitter tip is a tungsten based W(310) crystal tip.

11. The electron beam source device according to claim 7, wherein a cross-sectional shape of the aperture opening is selected from the group consisting of a circular aperture opening, a square aperture opening, a triangular aperture opening, a rectangular aperture opening, and an elliptical aperture opening.

12. The electron beam source device according to claim 7, wherein the extractor electrode has a cup-shaped structure, the cup-shaped structure being arranged approximately concentrically with respect to the emitter tip.

13. The electron beam source device according to claim 7, further comprising one or more voltage supplies configured for applying a potential difference between the extractor electrode and the emitter tip, the potential difference being in a range between about 3 kV and about 20 kV.

14. A method of operating an electron beam source device for a wafer imaging system, the method comprising:
  emitting electrons from an emitter tip wherein the emitter tip is provided as a cold field emitter or thermally assisted cold field emitter; and
  extracting the electrons from the emitter tip with an extractor electrode having an aperture opening,
  wherein an aperture angle of the beam source device is 2 degree or below, the aperture angle being defined by a width of the aperture opening and a distance between the emitter tip and the extractor electrode, wherein the distance between the emitter tip and the extractor electrode is in a range from about 0.1 mm to about 2 mm; and
  controlling emission of the electrons with a suppressor electrode arranged concentrically around the emitter tip, the emitter tip protruding through the suppressor electrode.

15. The method according to claim 14, wherein the distance between the emitter tip and the extractor electrode is in a range from about 0.2 mm to about 1.5 mm.

16. The method according to claim 14, further comprising applying a potential difference between the extractor electrode and the emitter tip, the potential difference being in a range between 3 kV and 20 kV.

17. The method according to claim 14, wherein the emitter tip is heated to a temperature above ambient temperature.

18. The method according to claim 14, wherein providing the aperture angle of the beam source device comprises providing an area of the aperture opening such that a charged particle beam current emitted by the emitter tip is reduced by a factor larger than 1000.

19. The method according to claim 14, wherein the electrons emitted from the emitter tip form a primary electron beam with a brightness of $3\times10^8$ A/m$^2$/sr/eV or above.

20. The method according to claim 19, wherein the electrons emitted from the emitter tip form a primary electron beam with a brightness of $1\times10^9$ A/m$^2$/sr/eV or above.

* * * * *

UNITED STATES PATENT AND TRADEMARK OFFICE
CERTIFICATE OF CORRECTION

| | | |
|---|---|---|
| PATENT NO. | : 8,987,692 B2 | Page 1 of 1 |
| APPLICATION NO. | : 14/203377 | |
| DATED | : March 24, 2015 | |
| INVENTOR(S) | : Adamec et al. | |

It is certified that error appears in the above-identified patent and that said Letters Patent is hereby corrected as shown below:

In the Claims:

Column 10, Claim 1, Line 14, please delete "Protruding" and insert --protruding-- therefor;

Column 10, Claim 6, Line 39, please delete "electron" and insert --electrons-- therefor. (2nd Occurrence)

Signed and Sealed this
Fifteenth Day of September, 2015

Michelle K. Lee
*Director of the United States Patent and Trademark Office*